United States Patent
Kainuma et al.

(10) Patent No.: US 10,840,008 B2
(45) Date of Patent: Nov. 17, 2020

(54) ELECTRONIC COMPONENT AND ELECTRONIC COMPONENT-MOUNTED STRUCTURE

(71) Applicant: Murata Manufacturing Co., Ltd., Nagaokakyo (JP)

(72) Inventors: Yasuaki Kainuma, Nagaokakyo (JP); Seiji Katsuta, Nagaokakyo (JP); Akihiro Motoki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 490 days.

(21) Appl. No.: 14/988,800

(22) Filed: Jan. 6, 2016

(65) Prior Publication Data
US 2016/0212850 A1   Jul. 21, 2016

(30) Foreign Application Priority Data

Jan. 15, 2015 (JP) .................. 2015-006119
Oct. 16, 2015 (JP) .................. 2015-204270

(51) Int. Cl.
| | | |
|---|---|---|
| H01C 1/14 | (2006.01) |
| H01F 27/29 | (2006.01) |
| H01L 41/047 | (2006.01) |
| H01G 4/232 | (2006.01) |
| H01F 17/00 | (2006.01) |
| H01G 4/30 | (2006.01) |

(Continued)

(52) U.S. Cl.
CPC .......... *H01F 27/292* (2013.01); *H01C 1/14* (2013.01); *H01F 17/0013* (2013.01); *H01G 4/232* (2013.01); *H01L 41/0472* (2013.01); *H01L 41/0477* (2013.01); *H01C 7/008* (2013.01); *H01G 4/30* (2013.01); *H05K 3/321* (2013.01); *H05K 2201/10636* (2013.01); *Y02P 70/50* (2015.11)

(58) Field of Classification Search
CPC .......... H05K 1/181; H01G 4/30; H01G 4/008
USPC .......................................... 174/260
See application file for complete search history.

(56) References Cited

U.S. PATENT DOCUMENTS

| | | | | |
|---|---|---|---|---|
| 4,615,908 A | * | 10/1986 | Behn .................. | H01G 4/2325 361/305 |
| 2007/0004202 A1 | * | 1/2007 | Fujii .................. | C23C 18/14 438/678 |

(Continued)

FOREIGN PATENT DOCUMENTS

| | | |
|---|---|---|
| JP | 01-289231 A | 11/1989 |
| JP | 05-283273 A | 10/1993 |

(Continued)

OTHER PUBLICATIONS

Official Communication issued in Japanese Patent Application No. 2015-204270, dated Jun. 4, 2019.

*Primary Examiner* — Stanley Tso
(74) *Attorney, Agent, or Firm* — Keating & Bennett, LLP

(57) ABSTRACT

An electronic component includes an electronic component body and an external electrode. The external electrode is disposed on the electronic component body. The external electrode includes a Pd plating layer and a Ni plating layer. The Pd plating layer defines an outermost layer. The Ni plating layer is disposed inside the Pd plating layer. The Ni plating layer is partly exposed from the Pd plating layer.

13 Claims, 2 Drawing Sheets

(51) Int. Cl.
*H01C 7/00* (2006.01)
*H05K 3/32* (2006.01)

(56) References Cited

U.S. PATENT DOCUMENTS

| | | | | |
|---|---|---|---|---|
| 2009/0296312 A1* | 12/2009 | Ueda | ..................... | H01C 1/142 |
| | | | | 361/306.3 |
| 2010/0093131 A1* | 4/2010 | Maeda | ................ | B23K 1/0016 |
| | | | | 438/107 |
| 2010/0202098 A1* | 8/2010 | Yanagida | ............... | H01G 4/232 |
| | | | | 361/305 |
| 2010/0258954 A1* | 10/2010 | Andoh | .............. | H01L 23/49811 |
| | | | | 257/784 |
| 2011/0018943 A1* | 1/2011 | Owaki | ................ | B41J 2/14233 |
| | | | | 347/54 |
| 2012/0007709 A1* | 1/2012 | Taniguchi | ............. | H01G 4/005 |
| | | | | 336/200 |
| 2013/0148264 A1* | 6/2013 | Hagiwara | ............. | H01G 9/008 |
| | | | | 361/500 |
| 2013/0329339 A1* | 12/2013 | Masuda | ................... | H01G 4/06 |
| | | | | 361/311 |
| 2014/0290998 A1* | 10/2014 | Ahn | ........................ | H01G 4/30 |
| | | | | 174/260 |
| 2016/0073515 A1* | 3/2016 | Shimizu | ................ | H05K 1/185 |
| | | | | 361/761 |

FOREIGN PATENT DOCUMENTS

| | | |
|---|---|---|
| JP | 2000-299243 A | 10/2000 |
| JP | 2003-109838 A | 4/2003 |

* cited by examiner

ELECTRONIC COMPONENT AND ELECTRONIC COMPONENT-MOUNTED STRUCTURE

BACKGROUND OF THE INVENTION

1. Field of the Invention

The present invention relates to an electronic component and an electronic component-mounted structure.

2. Description of the Related Art

In recent years, a larger number of electronic components such as ceramic electronic components are mounted on a wiring substrate incorporated in an electronic device. Conventionally, for mounting these electronic components on the wiring substrate, solder containing Pb or the like has been generally used. In recent years, because of environmental concerns, attempts to mount an electronic component by using Pb-free solder has been eagerly conducted. The Pb-free solder, however, has a relatively high melting point. Accordingly, when Pb-free solder is used, a treatment at high temperature is required at the time of soldering. As a result, cracking is likely to occur in a ceramic element due to the difference in coefficients of thermal expansion between the external terminal electrode and the ceramic element of the ceramic electronic component. Also, as automobiles become more electronically controlled and the size of the engine compartment is further reduced to increase the vehicle interior space, an ECU (Electronic Control Unit) of automobiles is installed at a position closer to the engine, the transmission and the like. Therefore, electronic components have come into use in a higher temperature environment, and displacement by the expansion and contraction of the terminal electrode and the solder caused by temperature changes under such an environment generate a mechanical stress and lead to cracking in the solder itself.

In light of the above, a conductive adhesive has received attention as an alternative to solder. In a conductive adhesive used for such a purpose, a metal filler formed of Ag or the like is added to a thermosetting resin such as epoxy resin. The thermosetting temperature of the conductive adhesive is lower than the melting point of the Pb-free solder. Therefore, when the conductive adhesive is used for mounting a ceramic electronic component, the thermal stress applied to the ceramic element can be reduced. Also, since the conductive adhesive contains resin with excellent elasticity, the problem of cracking in the binder itself can be solved. One example of the ceramic electronic component capable of being mounted with such a conductive adhesive is disclosed in JP-A 2000-299243.

For example, JP-A 2000-299243 discloses a ceramic electronic component that can be mounted with a conductive adhesive that is a multilayer capacitor including a first metal layer provided with an external electrode formed by applying and baking a conductive paste containing Cu, a Ni plating layer formed on the first metal layer, and a Pd plating layer formed on the Ni plating layer.

There is an unmet need to increase the mounting strength between an electronic component and a mounting substrate in mounting the electronic component by using a conductive resin adhesive.

SUMMARY OF THE INVENTION

Preferred embodiments of the present invention provide an electronic component capable of being mounted on a mounting substrate with high mounting strength with a conductive resin adhesive.

An electronic component according to a preferred embodiment of the present invention includes an electronic component body, and an external electrode. The external electrode is disposed on the electronic component body. The external electrode includes a Pd plating layer and a Ni plating layer. The Pd plating layer defines the outermost layer. The Ni plating layer is disposed inside the Pd plating layer. The Ni plating layer is partially exposed from the Pd plating layer.

In an electronic component according to a preferred embodiment of the present invention, the Ni plating layer having high affinity with the conductive resin adhesive is partially exposed from the Pd plating layer. Accordingly, the electronic component according to a preferred embodiment of the present invention is able to be mounted on the mounting substrate with high mounting strength by using a conductive resin adhesive.

In an electronic component according to a preferred embodiment of the present invention, it is preferred that at least a portion of the exposed portion of the Ni plating layer is oxidized. In this case, the affinity of the Ni plating layer with the conductive adhesive is further improved. And thus it is possible to further improve the mounting strength when a conductive resin adhesive is used.

In an electronic component according to a preferred embodiment of the present invention, the Pd plating layer may include a pinhole facing the Ni plating layer.

In an electronic component according to a preferred embodiment of the present invention, a thickness of the Pd plating layer is preferably about 0.02 µm or less, for example. In this case, the production cost of the electronic component is able to be reduced.

An electronic component-mounted structure according to a preferred embodiment of the present invention includes an electronic component according to one of various preferred embodiments of the present invention, a mounting substrate, and a conductive resin adhesive. On the mounting substrate, the electronic component is mounted. The conductive resin adhesive bonds the external electrode and the mounting substrate. The conductive resin adhesion portion is in contact with the Ni plating layer.

In an electronic component-mounted structure according to a preferred embodiment of the present invention, the Ni plating layer having high affinity with the conductive resin adhesive is partly exposed from the Pd plating layer. Therefore, the mounting strength of the electronic component is high.

According to various preferred embodiments of the present invention, it is possible to provide an electronic component capable of being mounted on the mounting substrate with high mounting strength by using a conductive resin adhesive.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
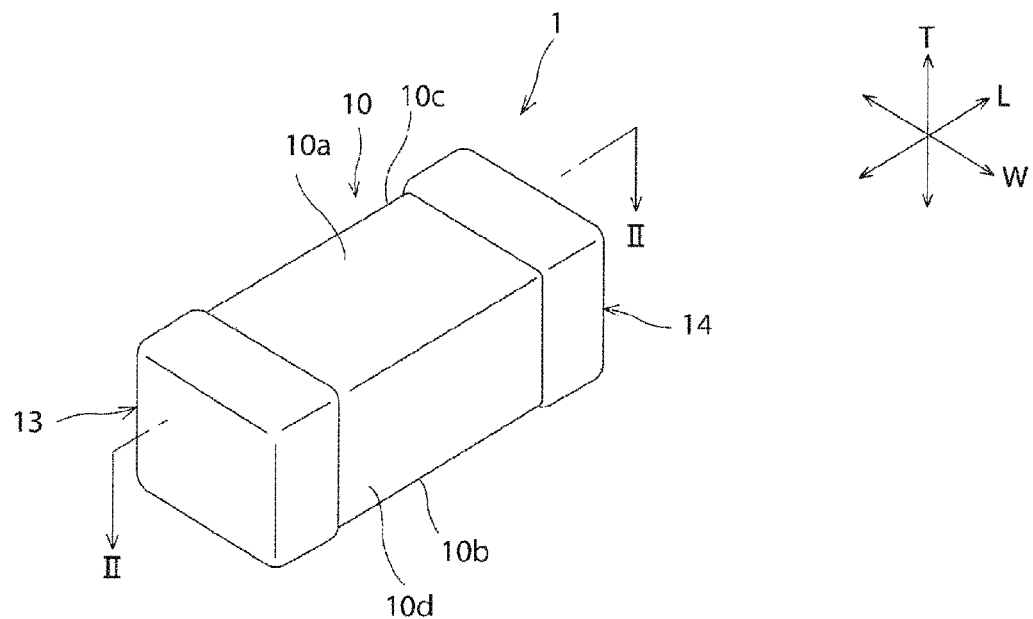
FIG. 1 is a schematic perspective view of an electronic component according to a preferred embodiment of the present invention.

Hereinafter, exemplary preferred embodiments of the present invention will be described. It is to be noted that the following preferred embodiments are merely for exemplification. The present invention is not limited to the following preferred embodiments in any way.

In different drawings referred in the preferred embodiments and the like, an element or member having the same or substantially the same function is denoted by the same symbol. Drawings referred to in the description of the preferred embodiments and the like are depicted schematically. The dimensional proportion of the elements or members depicted in the drawings can be different from the dimensional proportion of the actual element or member. Also between different drawings, the dimensional proportion of the element or member can be different. The dimensional proportion or the like of a specific element or member should be judged in consideration of the following description.

Hereinafter, the structure of an electronic component 1 will be described.

Figure 2:
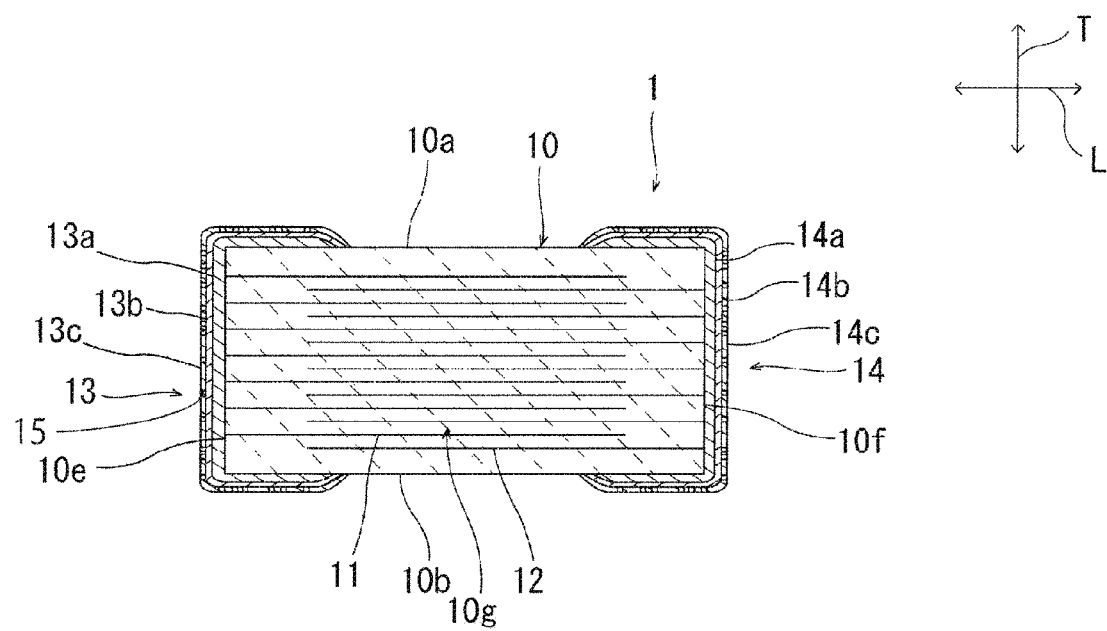
FIG. 2 is a schematic section view of a cut out portion along the line II-II in FIG. 1.

FIG. 1 is a schematic perspective view of an electronic component according to a preferred embodiment of the present preferred embodiment, and FIG. 2 is a schematic section view of a cut out portion along the line II-II in FIG. 1.

The electronic component 1 illustrated in FIG. 1 and FIG. 2 may be a ceramic capacitor, or may be a piezoelectric component, a thermistor, or an inductor.

The electronic component 1 includes a rectangular or substantially rectangular parallelepiped electronic component body (ceramic element) 10. The electronic component body 10 includes first and second principal surfaces 10a, 10b, first and second lateral surfaces 10c, 10d (see FIG. 2), and first and second end surfaces 10e, 10f (see FIG. 2). The first and second principal surfaces 10a, 10b extend along a length direction L and a width direction W. The first and second lateral surfaces 10c, 10d extend along a thickness direction T and the length direction L. The first and second end surfaces 10e, 10f extend along the thickness direction T and the width direction W. The length direction L, the width direction W and the thickness direction T are perpendicular or substantially perpendicular to each other.

In the description of preferred embodiments of the present invention, the "rectangular parallelepiped" includes rectangular parallelepipeds in which corner portions or ridge line portions are rounded. In other words, the "rectangular parallelepiped" member is a generic term for members having first and second principal surfaces, first and second lateral surfaces and first and second end surfaces. The principal surfaces, the lateral surfaces and the end surfaces may be entirely or partly provided with uneven portions and the like.

The dimension of the electronic component body 10 is not particularly limited. For example, the thickness of the electronic component body 10 is preferably about 0.2 mm to about 3.0 mm inclusive, the length is preferably about 0.4 mm to about 5.7 mm inclusive, and the width is preferably about 0.2 mm to about 5.0 mm inclusive.

The electronic component body 10 is preferably made of appropriate ceramics suited for the function of the electronic component 1. Specifically, when the electronic component 1 is a capacitor, the electronic component body 10 can be formed of dielectric ceramics. Specific examples of the dielectric ceramics include $BaTiO_3$, $CaTiO_3$, $SrTiO_3$, and $CaZrO_3$. To the electronic component body 10, a secondary ingredient such as a Mn compound, a Mg compound, a Si compound, a Fe compound, a Cr compound, a Co compound, a Ni compound, or a rare earth compound may be appropriately added depending on the characteristic required for the electronic component 1.

When the electronic component 1 is a piezoelectric component, the electronic component body can be formed of piezoelectric ceramics. Specific examples of the piezoelectric ceramics include PZT (lead zirconate titanate) ceramics.

When the electronic component 1 is, for example, a thermistor, the electronic component body can be formed of semiconductor ceramics. Specific examples of the semiconductor ceramics include spinel ceramic.

When the electronic component 1 is, for example, an inductor, the electronic component body can be formed of magnetic ceramics. Specific examples of the magnetic ceramics include ferrite ceramic.

Hereinafter, in the present preferred embodiment, an exemplary case in which the electronic component 1 is a multilayer ceramic capacitor will be described.

As illustrated in FIG. 2, internal electrodes are provided inside the electronic component body 10. Specifically, a plurality of first internal electrodes 11 and a plurality of second internal electrodes 12 are provided inside the electronic component body 10.

The first internal electrodes 11 are preferably rectangular or substantially rectangular, for example. The first internal electrodes 11 are parallel or substantially parallel with the first and the second principal surfaces 10a, 10b (see FIG. 1). In other words, the first internal electrodes 11 are provided along the length direction L and the width direction W. The first internal electrodes 11 are exposed at the first end surface 10e, and are not exposed at the first and the second principal surfaces 10a, 10b, the first and the second lateral surfaces 10c, 10d and the second end surface 10f.

The second internal electrodes 12 preferably are rectangular or substantially rectangular, for example. The second internal electrodes 12 are parallel or substantially parallel with the first and the second principal surfaces 10a, 10b (see FIG. 1). In other words, the second internal electrodes are provided along the length direction L and the width direction W. Therefore, the second internal electrodes 12 and the first internal electrodes 11 are parallel or substantially parallel with each other. The second internal electrodes 12 are exposed at the second end surface 10f, and are not exposed at the first and the second principal surfaces 10a, 10b, the first and the second lateral surfaces 10c, 10d and the first end surface 10e.

The first and the second internal electrodes 11, 12 are alternately provided along the thickness direction T. The first internal electrode 11 and the second internal electrode 12 that are adjacent to each other in the thickness direction T are opposed to each other with a ceramic portion 10g interposed therebetween. The thickness of the ceramic portion 10g can be, for example, about 0.5 μm to 10 μm inclusive, for example.

The first and the second internal electrodes 11, 12 can be formed of appropriate conductive materials. The first and the second internal electrodes 11, 12 can be formed of, for example, metal selected from the group consisting of Ni, Cu, Ag, Pd and Au, or an alloy containing at least one metal selected from the group consisting of Ni, Cu, Ag, Pd and Au (e.g., Ag—Pd alloy).

The thicknesses of the first and the second internal electrodes 11, 12 are preferably, for example, about 0.2 µm to about 2.0 µm inclusive.

As illustrated in FIG. 1 and FIG. 2, the electronic component 1 includes first and second external electrodes 13, 14. The first external electrode 13 is electrically connected with the first internal electrodes 11 in the first end surface 10e. Meanwhile, the second external electrode 14 is electrically connected with the second internal electrodes 12 in the second end surface 10f.

The first external electrode 13 extends to the first and the second principal surfaces 10a, 10b and the first and the second lateral surfaces 10c, 10d from the first end surface 10e. Meanwhile, the second external electrode 14 extends to the first and the second principal surfaces 10a, 10b and the first and the second lateral surfaces 10c, 10d from the second end surface 10f. The first and the second external electrodes 13, 14 may extend merely to the first and the second principal surfaces 10a, 10b, or may not extend to one principal surface and lateral surface.

The first external electrode 13 preferably includes a fired electrode layer 13a, a first plating layer 13b, and a second plating layer 13c. The fired electrode layer 13a, the first plating layer 13b, and the second plating layer 13c are laminated in this order from the side of the electronic component body 10. The second external electrode 14 preferably includes a fired electrode layer 14a, a first plating layer 14b, and a second plating layer 14c. The fired electrode layer 14a, the first plating layer 14b, and the second plating layer 14c are laminated in this order from the side of the electronic component body 10.

The fired electrode layers 13a, 14a are provided on the electronic component body 10. The fired electrode layers 13a, 14a are in contact with the electronic component body 10.

The "fired electrode layer" used herein is an electrode layer formed by firing a paste containing metal powder. Therefore, the fired electrode layers 13a, 14a contain metal. Preferably, the fired electrode layers 13a, 14a contain a glass component in addition to metal. When the fired electrode layers 13a, 14a contain a glass component, the glass component functions as an adhesive, and ensures adhesion between the fired electrode layers 13a, 14a and the electronic component body 10. Therefore, it is possible to prevent the water from entering inside the electronic component body 10.

The fired electrode layers 13a, 14a preferably contain at least one of Cu, Ni, Ag, Pd, Ag—Pd alloy and Au, for example, and more preferably contain Cu.

The thicknesses of the fired electrode layers 13a, 14a are preferably about 1 µm to about 15 µm inclusive, for example. When the electronic component 1 is mounted on the mounting substrate, the thicknesses of the fired electrode layers 13a, 14a can be measured at the middle positions in the length direction L and in the width direction W of the part positioned on the principal surface on the side of the mounting substrate.

The first plating layer 13b is disposed on the fired electrode layer 13a. The first plating layer 14b is disposed on the fired electrode layer 14a. The first plating layers 13b, 14b preferably are Ni plating layers. The thicknesses of the first plating layers 13b, 14b are preferably about 3 µm to about 8 µm inclusive, for example.

The second plating layer 13c is disposed on the first plating layer 13b. The second plating layer 13c defines the outermost layer of the first external electrode 13. The second plating layer 14c is disposed on the first plating layer 14b.

The second plating layer 14c defines the outermost layer of the second external electrode 14. The second plating layers 13c, 14c preferably are Pd plating layers. The thicknesses of the second plating layers 13c, 14c are preferably about 0.01 µm to about 0.04 µm inclusive, and more preferably about 0.01 µm to about 0.02 µm inclusive, for example. The thicknesses of the second plating layers 13c, 14c can be measured by irradiating the surfaces of the second plating layers 13c, 14c with fluorescence X-rays.

In the electronic component 1, the first plating layers 13b, 14b are partly exposed from the second plating layers 13c, 14c. To be more specific, the second plating layers 13c, 14c are provided with a plurality of pinholes 15. Each pinhole 15 faces the first plating layers 13b, 14b. Preferably, each pinhole 15 is formed in such a manner that the area ratio between the area where a Ni element is detected, and the area where a Pd element is detected (Ni element detected area/Pd element detected area) during XPS analysis of the surfaces of the external electrodes 13, ranges from about 0.01 to about 0.2, for example. This further improves the advantageous effects of various preferred embodiments of the present invention.

In the description of various preferred embodiments of the present invention, the term "pinhole" indicates the portion where the second plating layers 13c, 14c are absent on the first plating layers 13b, 14b. The case where second plating layers 13c, 14c with a length of about 10 nm or longer are present is determined as "second plating layers 13c, 14c are present". Each pinhole is preferably present on the mounting surface, and may be present on the whole surface of the external electrode.

The portions of the first plating layers 13b, 14b exposed from the second plating layers 13c, 14c are at least partly oxidized. In other words, at least a portion of the surfaces of the portions of the first plating layers 13b, 14b exposed from the second plating layers 13c, 14c is composed of nickel oxide. This can be confirmed by observing the surfaces of the external electrodes 13, 14 by XPS analysis and analyzing the condition of nickel.

Figure 3:
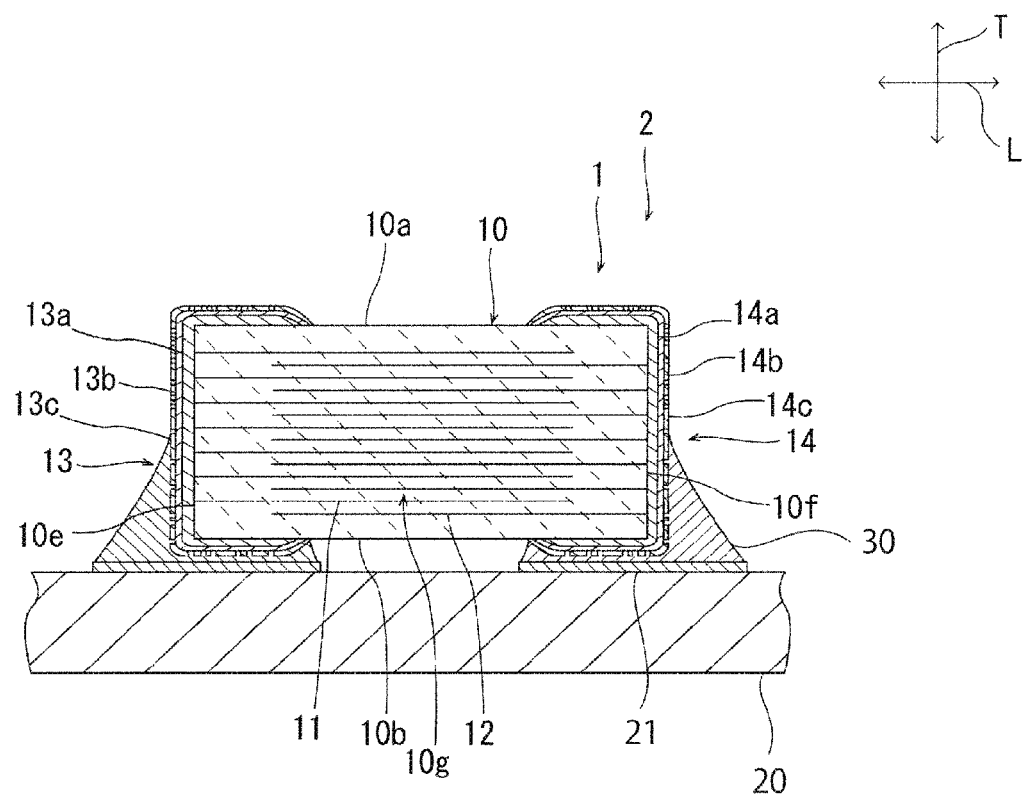
FIG. 3 is a schematic section view of an electronic component-mounted structure according to a preferred embodiment of the present invention.

FIG. 3 is a schematic section view of an electronic component-mounted structure according to a preferred embodiment of the present invention. As illustrated in FIG. 3, the electronic component-mounted structure 2 includes the electronic component 1 and a mounting substrate 20. The electronic component 1 is mounted on the mounting substrate 20. The electronic component 1 and the mounting substrate 20 are bonded with a conductive resin adhesive. Specifically, the external electrodes 13, 14 and the mounting substrate 20 are bonded with a conductive resin adhesive.

The conductive resin adhesive enters inside the pinhole and is in contact with the first plating layers 13b, 14b containing Ni.

Therefore, the external electrodes 13, 14 and the mounting substrate 20 are bonded by a conductive resin adhesion portion 30 formed by curing of the conductive resin adhesive.

As described above, in the present preferred embodiment, the first plating layers 13b, 14b defined by Ni plating layers are partly exposed from the second plating layers 13c, 14c defined by Pd plating layers. The affinity between the conductive resin adhesive and the Ni plating layer is higher than the affinity between the conductive resin adhesive and the Pd plating layer. Therefore, in the present preferred embodiment in which the first plating layers 13b, 14b defined by Ni plating layers are partly exposed, the bonding strength between the electronic component 1 and the mounting substrate 20 is high. This is because the conductive resin adhesive 30 adheres by reaction with an —O or —OH group on the metal surface rather than by direct reaction with the metal of the external electrode, and thus the reactivity with the conductive resin adhesive 30 is improved by partial exposure of the first plating layers 13b, 14b defined by Ni plating layers having more —O or —OH group than the second plating layers 13c, 14c defined by Pd plating layers having less —O or —OH group.

It is preferred that the exposed portions of the first plating layers 13b, 14b defined by Ni plating layers are at least partly oxidized. In this case, the bonding strength between the exposed portions of the first plating layers 13b, 14b and the conductive resin adhesion portion 30 is still higher. Therefore, it is possible to further increase the bonding strength between the electronic component 1 and the mounting substrate 20.

A method for producing the electronic component 1 is not particularly limited. The electronic component 1 can be produced in the following manner, for example.

First of all, the electronic component body 10 including the first and the second internal electrodes 11, 12 is prepared. To be more specific, a ceramic paste containing ceramic powder is applied in the form of a sheet, for example, by a screen printing method and dried to form a ceramic green sheet.

Then on the ceramic green sheet, a conductive paste for formation of internal electrode is applied in a predetermined pattern by, e.g., screen printing, and thus a ceramic green sheet on which a conductive pattern for formation of internal electrodes is formed, and a ceramic green sheet on which a conductive pattern for formation of internal electrodes is not formed are prepared. The ceramic paste and the conductive paste for formation of internal electrodes may contain e.g., a known binder or solvent.

Subsequently, a predetermined number of ceramic green sheets on which a conductive pattern for formation of internal electrodes is not formed are stacked, and a ceramic green sheet on which conductive pattern for formation of internal electrodes is formed is sequentially laminated thereon, and then a predetermined number of ceramic green sheets on which a conductive pattern for formation of internal electrodes is not formed are laminated to produce a mother laminate. The mother laminate may be pressed in the direction of lamination by isostatic pressing and the like as necessary.

The mother laminate is cut into a predetermined shape and size to produce a plurality of raw ceramic elements. At this time, barrel finishing or the like may be conducted on the raw ceramic elements to round the ridge line portions or corner portions.

Then the raw ceramic element is fired. This completes the electronic component body 10. The firing temperature of the raw ceramic element can be appropriately selected depending on the used ceramic or conductive material. The firing temperature of the raw ceramic elements is for example, about 900° C. to about 1300° C. inclusive.

Next, a conductive paste is applied on both end surfaces of the fired electronic component body 10 and baked to form the fired electrode layers 13a, 14a. Preferably, the baking temperature is, for example, about 700° C. to about 1000° C. inclusive. The fired electrode layers 13a, 14a may be fired simultaneously with the raw ceramic element.

Subsequently, on the fired electrode layers 13a, 14a, the first plating layers 13b, 14b containing Ni and the second plating layers 13c, 14c containing Pd are formed in this order. Through these steps, it is possible to complete the electronic component 1.

By adjusting the conditions such as the film thicknesses of the second plating layers 13c, 14c containing Pd and the process time of the second plating layers 13c, 14c containing Pd, it is possible to partly expose the first plating layers 13b, 14b containing Ni from the second plating layers 13c, 14c containing Pd.

Hereinafter, various preferred embodiments of the present invention will be described more specifically based on concrete non-limiting examples, however, the present invention is not limited in any way by the following examples, and can be appropriately modified and practiced without departing from the scope of the present invention.

EXAMPLE 1

An electronic component (multilayer ceramic capacitor) having the following structure was produced according to the method described in the above preferred embodiments. The formed Pd plating layer had the film thickness of 0.02 μm.

Conditions in forming Ni plating layer
Barrel: Diameter 67 mmϕ-Width 110 mm
Media material: Solder shot 0.7 mmϕ
Media amount: 60 mL
Chip: Longitudinal dimension: 1.0 mm, Width dimension: 0.5 mm,
Thickness dimension: 0.5 mm
Number of revolutions of barrel: 60 rpm
Plating solution: Composition
  Nickel sulfate 365 g/L
  Nickel chloride 65 g/L
  Boric acid 40 g/L
Temperature: 60° C.
pH: 4.2
Current: 8 A
Time: 167 minutes (aimed at 5 μm)
  Conditions in forming Pd plating layer
Barrel: Diameter 67 mmϕ-Width 110 mm
Media material: Solder shot 0.7 mmϕ
Media amount: 60 mL
Chip: Longitudinal dimension: 1.0 mm, Width direction: 0.5 mm,
Thickness direction: 0.5 mm
Number of revolutions of barrel: 60 rpm
Plating solution: PALLADEX LF5 (product of ELECTROPLATING ENGINEERS OF JAPAN Ltd.)
Anode: Ti/Pt insoluble anode
Temperature: 55° C.
pH: 8.8
Current: 1 A
Time: 5 minutes

COMPARATIVE EXAMPLE 1

A sample was produced in the same manner as Example 1 except that the formation time of the Pd plating layer was 20 minutes. The film thickness of the formed Pd plating layer was 0.09 μm.

COMPARATIVE EXAMPLE 2

A sample was produced in the same manner as Example 1 except that the formation time of the Pd plating layer was 100 minutes. The film thickness of the formed Pd plating layer was 0.509 μm.

The external electrode of the sample produced in each of Example 1 and Comparative Examples 1 and 2 was analyzed by XPS under the following conditions, and the Ni/Pd ratio on the surface of the external electrode was determined. In Example 1, the Ni/Pd ratio was 0.03 to 0.06 inclusive. In Comparative Examples 1, 2, the Ni/Pd ratio was 0. These results reveal that a pinhole is formed in the Pd plating layer and the Ni plating layer is exposed only in Example 1. In Comparative Examples 1, 2, it can be seen that a pinhole is not formed in the Pd plating layer because the Ni/Pd ratio was 0.

XPS analysis condition:
Apparatus: Quantum 2000 available from PHYSICALELECTRONICS
Measuring site: Pd plating layer surface measuring area of electronic component: 100 μmϕ
Scanning range: 0 eV to 1200 eV inclusive
Evaluation of Bonding Strength Samples (each 100 samples) produced in each of Example 1 and Comparative Examples 1, 2 were mounted on an alumina substrate with an epoxy conductive resin adhesive. The curing temperature was 140° C. The curing time was 30 minutes to 60 minutes inclusive.

Then after leaving the mounted samples still for 1000 hours at 150° C., a load was applied to the second end surface along the length direction until the sample was removed from the alumina substrate.

Then the portion positioned on the second principal surface of the external electrode removed from the substrate was observed, and the ratio of the area of the portion where the conductive adhesion portion remains, to the area of the portion positioned on the second principal surface of the external electrode ((area of the portion where the conductive adhesion part remains)/(area of the portion positioned on the second principal surface of the external electrode)) was examined. In the sample of Example 1, the ratio ((area of the portion where the conductive adhesion portion remains)/(area of the portion positioned on the second principal surface of the external electrode)) was over 60%, for example. On the other hand, in the sample of Comparative Example 1, the ratio ((area of the portion where the conductive adhesion portion remains)/(area of the portion positioned on the second principal surface of the external electrode)) was about 10%, for example. In the sample of Comparative Example 2, the ratio ((area of the portion where the conductive adhesion portion remains)/(area of the portion positioned on the second principal surface of the external electrode)) was about 0%. These results reveal that in Example 1 in which a pinhole is formed in the Pd plating layer, the bonding strength between the external electrode and the conductive resin adhesion portion is high.

The ratio ((area of the portion where the conductive adhesion portion remains)/(area of the portion positioned on the second principal surface of the external electrode)) was determined in the following manner. First of all, the second principal surface of the sample was irradiated with the light from a white LED lamp, and the intensity of the radiation by the lamp was adjusted so that difference in brightness arose between the surface of the external electrode, and the surface of the conductive resin adhesion portion, and then imaging was conducted. By transforming the obtained image into a binary representation, the portion where the surface of the external electrode was exposed, and the portion where the conductive resin adhesion portion remained were distinguished from each other. Then by determining the area of each portion, the ratio ((area of the part where the conductive adhesion portion remains)/(area of the portion positioned on the second principal surface of the external electrode)) was calculated.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
an electronic component body including first and second principal surfaces extending along a length direction and a width direction, first and second lateral surfaces extending along a thickness direction and the length direction, and first and second end surfaces extending along the thickness direction and the width direction;
a plurality of internal electrodes provided inside of the electronic component body; and
an external electrode disposed on each of the first and the second end surfaces of the electronic component body, the external electrodes being electrically connected to the plurality of internal electrodes on the first and the second end surfaces; wherein
the external electrodes each include:
a Pd plating layer that defines an outermost layer;
a Ni plating layer disposed inside the Pd plating layer; and
a fired electrode layer that includes a glass component and a metal, is disposed on the electronic component body, and is disposed inside the Ni plating layer; and
the Ni plating layer is partially exposed through the Pd plating layer.

2. The multilayer ceramic capacitor according to claim 1, wherein an exposed portion of the Ni plating layer that is partially exposed from the Pd plating layer is at least partially oxidized.

3. The multilayer ceramic capacitor according to claim 1, wherein the Pd plating layer includes a pinhole facing the Ni plating layer.

4. The multilayer ceramic capacitor according to claim 1, wherein the Pd plating layer has a thickness of less than or equal to 0.02 μm.

5. The multilayer ceramic capacitor according to claim 1, wherein the fired electrode layer is made of a paste containing the metal and the glass component.

6. The multilayer ceramic capacitor according to claim 1, wherein the Pd plating layer includes a plurality of pinholes facing the Ni plating layer, and an area ratio between the area where Ni of the Ni plating layer and an area where Pd of the Pd plating layer is present is 0.01 to 0.2.

7. An electronic component-mounted structure comprising:
the multilayer ceramic capacitor according to claim 1;
a mounting substrate on which the multilayer ceramic capacitor is mounted; and
a conductive resin adhesion portion bonding the external electrode and the mounting substrate; wherein
the conductive resin adhesion portion is in contact with the Ni plating layer.

8. The electronic component-mounted structure according to claim 7, wherein the Pd plating layer includes a pinhole facing the Ni plating layer and the conductive resin adhesive is located inside of the pinhole to contact with the Ni plating layer.

9. The electronic component-mounted structure according to claim 7, wherein an exposed portion of the Ni plating layer that is partially exposed from the Pd plating layer is at least partially oxidized.

10. The electronic component-mounted structure according to claim 7, wherein the Pd plating layer includes a pinhole facing the Ni plating layer.

11. The electronic component-mounted structure according to claim 7, wherein the Pd plating layer has a thickness of less than or equal to 0.02 μm.

12. The electronic component-mounted structure according to claim 7, wherein the fired electrode layer is made of a paste containing the metal and the glass component.

13. The electronic component-mounted structure according to claim 7, wherein the Pd plating layer includes a plurality of pinholes facing the Ni plating layer, and an area ratio between the area where Ni of the Ni plating layer and an area where Pd of the Pd plating layer is present is 0.01 to 0.2.

* * * * *